(12) United States Patent
Shiraishi et al.

(10) Patent No.: US 7,752,749 B2
(45) Date of Patent: Jul. 13, 2010

(54) ELECTRONIC COMPONENT MOUNTING METHOD AND ELECTRONIC COMPONENT MOUNTING DEVICE

(75) Inventors: Tsukasa Shiraishi, Osaka (JP); Yukihiro Ishimaru, Osaka (JP); Shinobu Masuda, Osaka (JP); Satoru Tomekawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 289 days.

(21) Appl. No.: 11/886,533

(22) PCT Filed: Mar. 17, 2006

(86) PCT No.: PCT/JP2006/305352
§ 371 (c)(1),
(2), (4) Date: Sep. 17, 2007

(87) PCT Pub. No.: WO2006/098426
PCT Pub. Date: Sep. 21, 2006

(65) Prior Publication Data
US 2009/0049687 A1    Feb. 26, 2009

(30) Foreign Application Priority Data
Mar. 17, 2005    (JP) .............................. 2005-076799

(51) Int. Cl.
*K05K 3/34* (2006.01)
(52) U.S. Cl. .............................. 29/840; 29/832; 29/836; 29/837; 29/839; 29/843
(58) Field of Classification Search .................. 29/832, 29/836, 837, 839, 843
See application file for complete search history.

(56) References Cited

U.S. PATENT DOCUMENTS

2008/0128664 A1*    6/2008    Kitae et al. .................. 252/512

FOREIGN PATENT DOCUMENTS

| JP | 06-125169 | | 5/1994 |
|---|---|---|---|
| JP | 6-206744 | | 9/1994 |
| JP | 10-32225 | | 2/1998 |
| JP | 2000-12630 | | 1/2000 |
| JP | 2000133680 A | * | 5/2000 |
| JP | 2002-50861 | | 2/2002 |

* cited by examiner

*Primary Examiner*—Derris H Banks
*Assistant Examiner*—Azm Parvez
(74) *Attorney, Agent, or Firm*—McDermott Will & Emery LLP

(57) ABSTRACT

One of an electrode terminal of an electronic component and a connecting terminal of a wiring substrate is provided with solder beforehand, one of the wiring substrate and the electronic component is secured, and the electrode terminal and the connecting terminal are made to abut each other so that one of the wiring substrate and the electronic component, whichever is not secured, is held. The electronic component is heated so that the solder melts, and the solder is solidified while the electronic component is held, so that the electrode terminal and the connecting terminal are bonded to each other by the solder. Further, while an interval formed between the wiring substrate and the electronic component by the melted solder is being held, the electrode terminal and the connecting terminal are finely moved relative to each other with reference to a surface of the wiring substrate in an XYθ direction.

25 Claims, 11 Drawing Sheets

ELECTRONIC COMPONENT MOUNTING METHOD AND ELECTRONIC COMPONENT MOUNTING DEVICE

RELATED APPLICATIONS

This application is the U.S. National Phase under 35 U.S.C. §371 of International Application No. PCT/JP2006/305352, filed on Mar. 17, 2006, which in turn claims the benefit of Japanese Application No. 2005-076799, filed on Mar. 17, 2005, the disclosures of which Applications are incorporated by reference herein.

FIELD OF THE INVENTION

The present invention relates to a method of and a device for mounting an electronic component on a wiring substrate by means of soldering.

BACKGROUND OF THE INVENTION

So far has been conventionally employed a method of forming an electronic circuit by connecting an electronic component, examples of which include passive components such as a resistor and a capacitor or a functional component such as a semiconductor element, on a wiring substrate by means of the reflow soldering.

In the reflow soldering, a predetermined amount of soldering paste or the like is applied to given connecting terminals on the wiring substrate, and electrode terminals of the electronic component are then secured with an adhesive strength of the soldering paste so as to face the connecting terminals. After that, the wiring substrate to which the electronic component is adhered by the soldering paste is placed in a reflow furnace so that the solder is melted. As a result, the electrode terminals of the electronic component and the connecting terminals of the wiring substrate are connected to each other.

In the foregoing method, the wiring substrate and the electronic component are secured to each other with the adhesive strength of the soldering paste alone, and the two components are bonded to each other by a self-alignment effect resulting from the surface tension of the solder when the solder is melted so that displacement of any degree which might be generated between the connecting terminals and the electrode terminals can be resolved.

However, the following problem has arisen since a microchip component, a CSP package or a semiconductor element having the bare-chip structure is directly mounted so as to deal with a size and a thickness of the wiring substrate which is increasingly reduced in recent years. In the case where a thin electronic component such as a bare-chip semiconductor element is used on the wiring substrate, a heating process in the reflow generates warp or gurge, which results in the failure to obtain the self-alignment effect, and a part to be soldered unfavorably comes off and fails to be soldered. In the case where an electronic component having a micro size, such as a chip component having the 0603 size or a bare-chip semiconductor element which was polished to be thin, is used, these electronic components cannot be accurately placed at the connecting terminals by a wind pressure generated in the reflow furnace.

In order to solve the problem, there is available such a method that the solder is melted when the electronic component is pressurized and heated from a rear surface thereof by a heating/pressurizing head after the electrode terminals of the electronic component are adhered to the connecting terminals of the wiring substrate via the soldering paste, so that the electrode terminals and the connecting terminals are connected to each other. This method does not generate the displacement of the components described earlier. However, the self-alignment effect is not exerted, which makes it necessary to align the positions of the electrode terminals of the electronic component and the connecting terminals of the wiring substrate in advance with a high accuracy. It is further necessary to retain the electronic component and the wiring substrate, which were position-aligned, until the solder is melted and solidified.

In order to respond to the necessities, a method of mounting a semiconductor chip (hereinafter, referred to as first mounting method) designed to improve a positioning accuracy and a production efficiency in the surface mounting was proposed.

The first mounting method comprises steps of:
  applying the soldering paste to a predetermined position on the wiring substrate and place the electronic component;
  melting the soldering paste to finally reach at least a melting temperature and soldering leads of the electronic component to lands of the wiring substrate; and
  vibrating the wiring substrate until any of lead-land connecting points is cooled down to finally reach a solidification point after the soldering paste is melted at all of the connecting points.
  (for example, see the Patent Document 1).

According to the first mounting method, the applied vibration reduces a frictional resistance between the electronic component and the wiring substrate. In the state where the frictional resistance is reduced, the leads and the lands to be soldered are attracted to each other by the surface tension generated in the melted solder so that a distance therebetween can be minimized. As a result, they can be favorably soldered to each other.

Further, a method of mounting a semiconductor chip on a wiring substrate via a solder bump (hereinafter, referred to as second mounting method) was proposed.

The second mounting method comprises steps of:
  retaining the semiconductor chip in a bonding tool and align a position of the semiconductor chip with respect to the wiring substrate;
  making the solder bump of the position-aligned semiconductor chip contact an electrode pad at a predetermined position on the wiring substrate;
  heating and melting the solder bump;
  adjusting an interval between the wiring substrate and the semiconductor chip during the melting process; and
  correcting any displacement between the wiring substrate and the semiconductor chip after the melting process by driving the bonding tool in an XY θ direction using an self-alignment action of the melted solder bump.
  (for example, see the Patent Document 2)
  Patent Document 1: H06-260744 of the Japanese Patent Publication Laid-Open
  Patent Document 2: H10-032225 of the Japanese Patent Publication Laid-Open

DISCLOSURE OF THE INVENTION

Problems to be Solved by the Invention

According to the first mounting method, the vibration is applied to the wiring substrate in the state where the solder is heated and thereby melted, the frictional resistance between the electronic component and the wiring substrate is reduced, and the self-alignment effect is thereby effectively exerted. In general, however, the electronic component cannot be subjected to a load for pressing it in the wiring-substrate direction from outside, and the electronic component is easily movable due to the vibration. As a result, the electronic component is often misaligned with respect to the connecting terminals by the wind pressure in the reflow furnace. Further, the semiconductor chip, and the like, in which pitches are very fine, may be short-circuited due to the vibration.

The second mounting method, wherein heating and driving mechanisms are provided on the bonding-tool side, has the following problem. When the bonding tool is repeatedly heated, the heat is transmitted to an XYθ driving mechanism, which unfavorably deteriorates a sliding performance of a bearing mechanism or the like.

The present invention was made in order to solve the foregoing problems, and a main object thereof is to provide a mounting method and a mounting device for manufacturing an electronic component mounting body superior in productivity and reliability.

Means for Solving the Problems

In order to achieve the foregoing object, an electronic component mounting method according to the present invention is a method of mounting an electronic component comprising an electrode terminal on a wiring substrate comprising a connecting terminal via solder, comprising:

a first step for preparing at least one of the electronic component with solder at the electrode terminal and the wiring substrate with solder at the connecting terminal;

a second step for securing one of the wiring substrate and the electronic component;

a third step for making the electrode terminal of the electronic component and the connecting terminal of the wiring substrate abut each other in a state where one of the wiring substrate and the electronic component, whichever is not secured, is held;

a fourth step for melting the solder by heating the electronic component; and a fifth step for adhering the electrode terminal and the connecting terminal to each other using the solder by solidifying the solder while holding the electronic component, wherein the electrode terminal and the connecting terminal can be finely moved relative to each other in XYθ direction with reference to a surface of the wiring substrate in a state where an interval formed between the wiring substrate and the electronic component when the solder is melted is maintained in the fifth step.

According to the method, the electronic component can be accurately positioned when it is made to abut the mounting position on the wiring substrate, and an self-alignment effect resulting from a surface tension of the solder can be effectively exerted when the electronic component is made to abut the mounting position on the wiring substrate to be adhered thereto with the melted solder. As a result, the electronic component can be solder-connected in such a manner that any displacement is not caused. Further, a state can be achieved in which heat generated by a heating source is hardly transmitted to a fine-movement mechanism which can finely move in the XYθ direction.

Further, in the foregoing method, the electrode terminal and the connecting terminal can be finely moved relative to each other in the XYθ direction with a driving force generated resulting from the self alignment of the melted solder. Accordingly, the electronic component can be accurately positioned when it is made to abut the mounting position on the wiring substrate, and the self-alignment effect resulting from the surface tension of the solder can be effectively exerted when the electronic component is made to abut the mounting position on the wiring substrate to be adhered thereto with the melted solder.

An electronic component mounting method according to the present invention is a method of mounting an electronic component comprising an electrode terminal on a wiring substrate comprising a connecting terminal via solder, comprising:

a first step for securing one of the wiring substrate and the electronic component;

a second step for applying a resin composition including solder powder, convective additive and resin having fluidity at a melting temperature of the solder powder to a region where the connecting terminal is formed or a surface on which the electrode terminal is formed in one of the wiring substrate and the electronic component which is secured;

a third step for making the electrode terminal of the electronic component and the connecting terminal of the wiring substrate abut each other with the resin composition interposed therebetween in a state where one of the wiring substrate and the electronic component, whichever is not secured, is held; and a fourth step for adhering the electrode terminal and the connecting terminal with each other using the solder powder by heating at least one of the wiring substrate and the electronic component while the state where the electrode terminal and the connecting terminal abut each other is retained.

In the fourth step, the solder powder is melted, and the melted solder powder is grown in such a manner that the solder powder is self-assembled between the electrode terminal and the connecting terminal by the convective additive, so that the electrode terminal and the connecting terminal are solder-connected to each other.

According to the method, the electrode terminal of the electronic component and the connecting terminal of the wiring substrate can be solder-connected to each other without the formation of the solder on one of the terminals beforehand.

Further, the solder powder can be effectively self-assembled since the electronic component is made to constantly abut the resin composition, and short-circuit failure resulting from the remaining solder powder after the connection hardly occurs.

Further, in the fourth step, a loading tool is preferably finely movable in the XYθ direction with reference to the surface of the wiring substrate in a state where one of the electronic component and the wiring substrate is held by the loading tool after the electrode terminal and the connecting terminal are connected by means of the melted solder powder. Accordingly, when the electrode terminal and the connecting terminal are connected to each other by means of the melted solder powder, the electronic component finely moves on the surface of the wiring substrate in the XYθ direction, and the self-alignment effect of the solder powder can be thereby effectively exerted. As a result, the displacement hardly occurs after the connection.

In the fourth step, after the electrode terminal and the connecting terminal are bonded to each other by means of the melted solder powder, the loading tool may be finely movable in the XYθ direction with reference to a surface of the electronic component where the electrode terminal is formed in the state where one of the electronic component and the wiring substrate is held by the loading tool.

Alternatively, after the electrode terminal and the connecting terminal are bonded to each other by means of the melted solder powder, a securing table may be finely movable in the XYθ direction with reference to a surface of the wiring substrate where the connecting terminal is formed in a state where one of the electronic component and the wiring substrate is held by the securing table.

Further, the loading tool or the securing tool may be finely moved by a driving force resulting from the self alignment of the melted solder powder. Accordingly, when the electrode terminal and the connecting terminal are bonded to each other by means of the melted solder powder, the loading tool or the securing table is finely moved on the surface of the wiring substrate in the XYθ direction. As a result, the self-alignment effect of the solder powder can be effectively exerted, and the displacement hardly occurs after the connection.

Further, the method may further comprise, after the fourth step:

a fifth step for hardening the resin in the resin composition by further applying heat thereto; and a sixth step for releasing the retention of the wiring substrate by the substrate loading tool after the resin is hardened.

Accordingly, the resin can be hardened with a displacement resolved because the self-alignment effect is effectively produced in the state where the solder powder is melted. Therefore, the connecting section is not displaced until the solder powder is cooled down to be solidified even though the electronic component or the wiring substrate is displaced. As a result, the wiring substrate on which the electronic component is mounted can be moved from the securing table immediately after the resin is hardened.

Further, it is preferable that the electronic component be a semiconductor element, and a metallic material having wettability with respect to the solder powder be formed on surfaces of the electrode terminal of the semiconductor element and the connecting terminal of the wiring substrate. Accordingly, the semiconductor element can be solder-connected to the wiring substrate when the metal having the good wettability with respect to the solder powder is simply provided at the electrode terminal of the semiconductor element, and the semiconductor element can be thereby mounted on the wiring substrate in a simplified manner. Examples of the metal having the good wettability with respect to the solder powder include single metal such as gold (Ag), silver (Ag), copper (Cu) and nickel (Ni), alloy of these metals, and solder represented by silver (Ag)-copper (Cu)-tin (Sn). The solder formed from any of these is formed by means of deposition, plating or the like.

An electronic component mounting device according to the present invention is an electronic component mounting device for mounting an electronic component comprising an electrode terminal on a wiring substrate comprising a connecting terminal via solder, comprising:

a securing table for securing one of the electronic component and the wiring substrate;

a loading tool for making the electrode terminal of the electronic component and the connecting terminal of the wiring substrate abut each other in a state where one of the wiring substrate and the electronic component, whichever is not secured, is held;

a heating mechanism for heating at least one of the electronic component and the wiring substrate in the state where the electrode terminal and the connecting terminal abut each other;

an XYθ driving mechanism for finely moving the electrode terminal and the connecting terminal relative to each other in the XYθ direction with reference to a surface of the wiring substrate in a state where the securing operation by the securing table and the holding operation by the loading tool are executed; and a securing mechanism for securing the electronic component and the wiring substrate relative to each other by halting the XYθ driving mechanism.

According to the foregoing constitution, the present invention can realize the connection by means of the solder with a high positioning accuracy. Further, the XYθ driving mechanism is prevented from being deteriorated by heat because the XYθ driving mechanism can be provided at a position distant from the heating mechanism. Therefore, the fine movement can be stably realized for a long period of time, which makes the device more reliable.

The XYθ driving mechanism can be variously constituted in such a manner that the wiring substrate is floatingly placed on liquid (for example, oil) resistant to the melting temperature of the solder, the wiring substrate is directly floatingly placed on a section where gas (for example, nitrogen gas) is sprayed out, or the wiring substrate is fixedly placed on a magnetic metallic plate and floated by a repellent power generated when the metallic plate and another magnetic metallic plate provided at a position opposite thereto are magnetized to the same pole.

Further, in the foregoing constitution, the XYθ driving mechanism may be operated until the solder is melted by the heating mechanism and solidified. Accordingly, the XY θ driving mechanism can be driven only when the solder is melted and the self-alignment effect is thereby exerted. As a result, the positioning can be highly accurate.

Further, in the foregoing constitution, the XYθ driving mechanism may comprise a heat blocking mechanism for controlling heat transmitted from the heating mechanism to the electronic component or the wiring substrate. When the heat blocking mechanism is provided, the XYθ driving mechanism can be prevented from being deteriorated by the heat. Examples of the heat blocking mechanism include materials having a small thermal conductivity such as resin where air bubbles are dispersed and porous ceramic. When any of these materials is provided between the retaining section at which the electronic component of the part loading tool is fixedly retained and the XYθ driving mechanism, the heat blocking mechanism can be realized.

An electronic component mounting device according to the present invention is an electronic component mounting device for mounting an electronic component comprising an electrode terminal on a wiring substrate comprising a connecting terminal via solder, comprising:

a securing table for securing one of the electronic component and the wiring substrate;

an application mechanism for applying a resin composition including solder powder, convective additive and resin having fluidity at a melting temperature of the solder powder to a region where the connecting terminal is formed or a surface on which the electrode terminal is formed in one of the wiring substrate and the electronic component which is secured by the securing table;

a loading tool for making the electrode terminal of the electronic component and the connecting terminal of the wiring substrate abut each other via the resin composition in a state where one of the wiring substrate and the electronic component, whichever is not secured, is held; and a heating mechanism for heating at least one of the wiring substrate and the electronic component in the state where the electrode terminal and the connecting terminal abut each other.

According to the foregoing constitution, the present invention can realize soldering connection by means of solder self-assembly with a good reproducibility and in a stable manner. Furthermore, short-circuit failure and connection failure hardly occur in such soldering connection.

In the foregoing constitution, it is preferable that the loading tool hold the electronic component and further comprise an XYθ driving mechanism for finely moving the electronic component with reference to a surface of the wiring substrate in the XYθ direction in the state where the electronic component is held.

In the foregoing constitution, it is preferable that the securing table secure the wiring substrate and further comprise an XYθ driving mechanism for finely moving the wiring substrate with reference to a surface of the electronic component where the electrode terminal is formed in the XY θ direction in the state where the wiring substrate is secured.

According to the foregoing constitution, wherein the loading tool or the securing table holds the electronic component or the wiring substrate, any displacement between the electronic component and the wiring substrate and any change of an interval between the two components, which result from gas generated when the convective additive is boiled or dissolved, can be prevented until the solder powder is self-assembled and the electrode terminal and the connecting terminal are connected by means of the solder. Thereby, the occurrence of short circuit therebetween can be prevented despite fine pitches, and the solder can be grown. Further, because the self-alignment effect can be effectively exerted after the two components are connected to each other, the displacement, if any, can be resolved.

An electronic component mounting device according to the present invention is an electronic component mounting device for mounting an electronic component comprising an electrode terminal on a wiring substrate comprising a connecting terminal via solder, comprising:

a securing table for securing one of the electronic component and the wiring substrate;

an application mechanism for applying a resin composition including solder powder, convective additive and resin having fluidity at a melting temperature of the solder powder to a region where the connecting terminal is formed or a surface on which the electrode terminal is formed in one of the wiring substrate and the electronic component which is secured by the securing table;

a loading tool for making the electrode terminal of the electronic component and the connecting terminal of the wiring substrate abut each other via the resin composition in a state where one of the wiring substrate and the electronic component, whichever is not secured, is held; and a heating mechanism for heating at least one of the wiring substrate and the electronic component in the state where the electrode terminal and the connecting terminal abut each other.

According to the foregoing constitution, the present invention can realize soldering connection by means of solder self-assembly with a good reproducibility and in a stable manner. Furthermore, short-circuit failure and connection failure hardly occur in such soldering connection.

In the foregoing constitution, it is preferable that the loading tool hold the electronic component and further comprise an XYθ driving mechanism for finely moving the electronic component with reference to a surface of the wiring substrate in the XYθ direction in the state where the electronic component is held. The XYθ driving mechanism is preferably operated in the state where the solder is melted after the electrode terminal and the connecting terminal are connected to each other by means of the solder.

In the foregoing constitution, it is preferable that the securing table secure the wiring substrate and further comprise an XYθ driving mechanism for finely moving the wiring substrate with reference to a surface of the electronic component where the electrode terminal is formed in the XY θ direction in the state where the wiring substrate is secured. The XYθ driving mechanism is preferably operated in the state where the solder is melted after the electrode terminal and the connecting terminal are connected to each other by means of the solder.

According to the foregoing constitution, wherein the loading tool holds the electronic component or the wiring substrate, any displacement between the electronic component and the wiring substrate and any change of an interval between the two components, which result from gas generated when the convective additive is boiled or dissolved, can be prevented until the solder powder is self-assembled and the electrode terminal and the connecting terminal are connected by means of the solder power. Thereby, the occurrence of short circuit therebetween can be prevented despite fine pitches, and the solder can be grown. Further, because the self-alignment effect can be effectively exerted after the two components are connected to each other, the displacement, if any, can be resolved.

Further, in the foregoing constitution, the heating mechanism preferably further comprises a function for further heating the heated solder to a temperature higher than the previous heating temperature. According to the foregoing constitution, when thermosetting resin, for example, is used as the resin in the resin composition, the electronic component and the wiring substrate can be fixedly adhered to each other by the thus generated heat in the state where the solder is melted. Therefore, the wiring substrate on which the electronic component is mounted can be removed from the securing table after the foregoing state is obtained. As a result, the productivity can be further improved.

Further, in the foregoing constitution, the XYθ driving mechanism may preferably further comprise a heat blocking mechanism for controlling heat transmitted from the heating mechanism. When the heat blocking mechanism is provided, the XYθ driving mechanism can be prevented from being deteriorated by the heat. Examples of the heat blocking mechanism include materials having a small thermal conductivity such as resin where air bubbles are dispersed and porous ceramic, which are provided between the retaining section for fixedly retaining the electronic component of the part loading tool and the XYθ driving mechanism. When any of these materials is provided between the retaining section at which the electronic component of the part loading tool is fixedly retained and the XYθ driving mechanism, the heat blocking mechanism can be realized.

EFFECT OF THE INVENTION

According to the present invention, any movement of the position of the electronic component can be prevented in steps after the position of the electronic component is determined by the part loading tool in the mounting process. Further, the self-alignment effect of the solder can be effectively utilized in order to connect the electronic component to the wiring substrate. As a result, when an electronic component comprising an electrode terminal provided with a large number of pins and narrow pitches is mounted, the productivity and the reliability can be improved.

Figure 1:
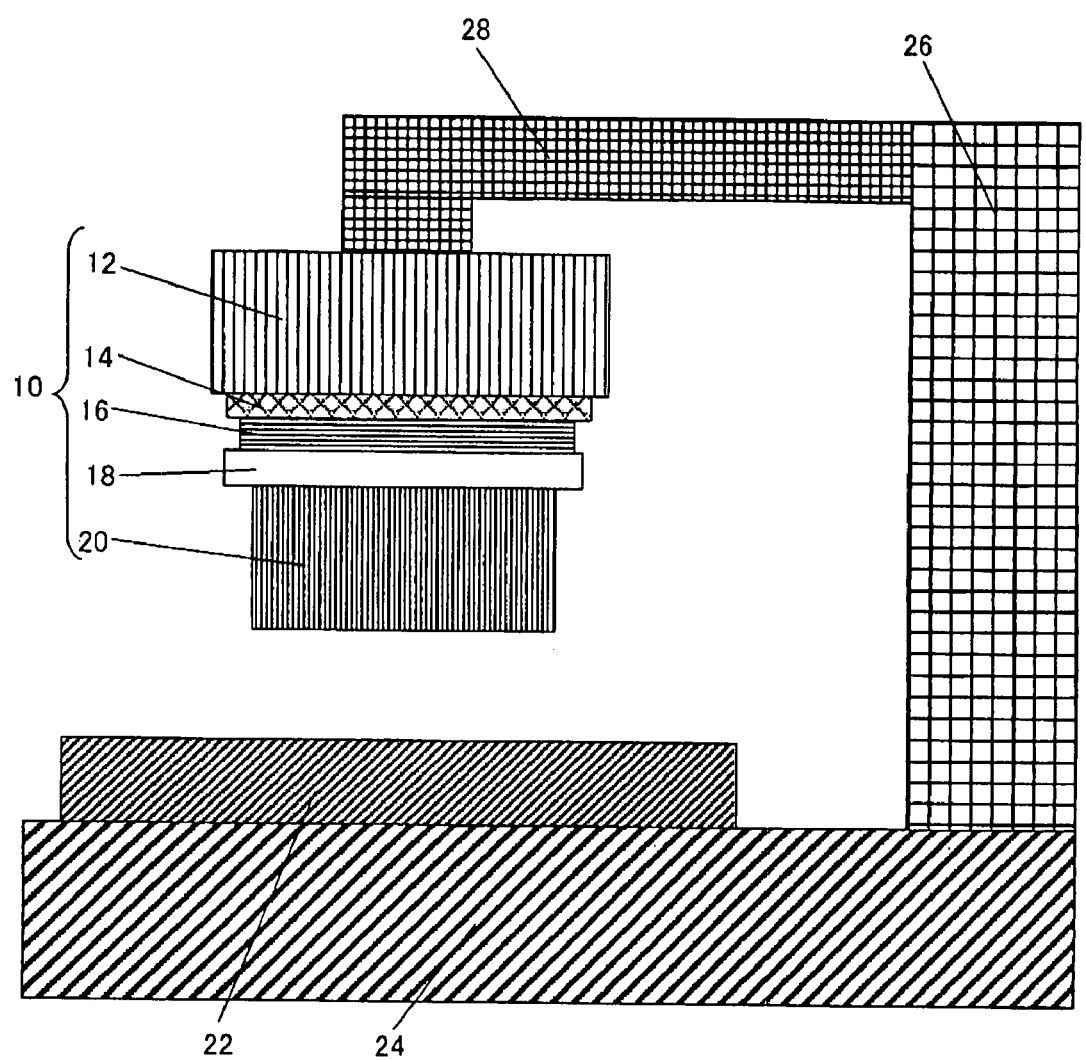
FIG. 1 is a sectional view illustrating a schematic constitution of an electronic component mounting device according to a first preferred embodiment of the present invention.
Figure 2:
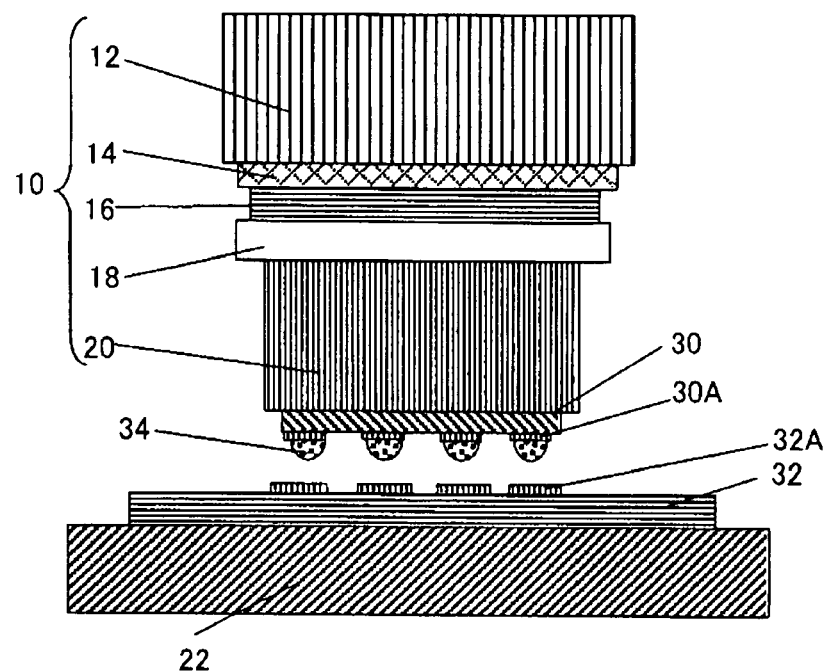
FIG. 2A is a sectional view of a first stage in a main process of a method of mounting the electronic component according to the first preferred embodiment.
FIG. 2B is a sectional view of a second stage in the main process of the method of mounting the electronic component according to the first preferred embodiment.
Figure 2:
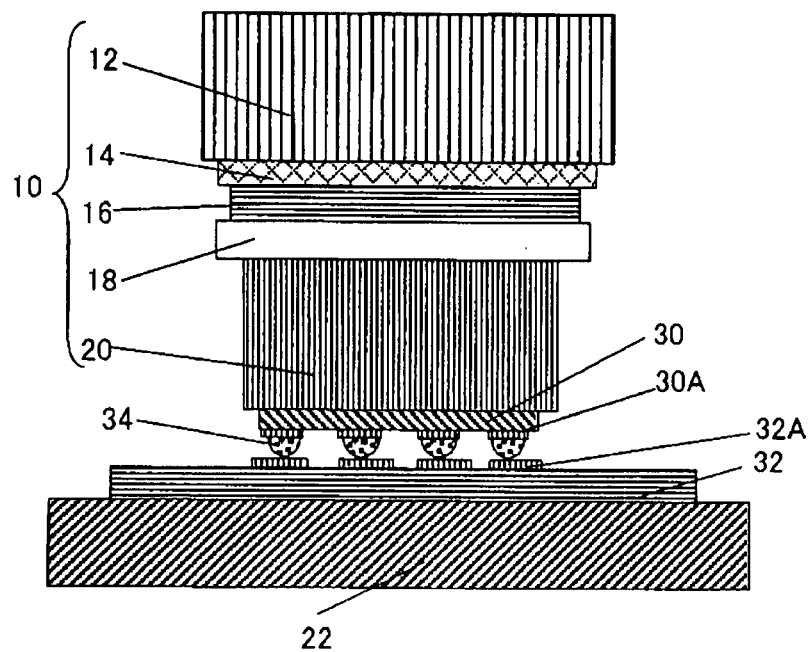
Figure 3:
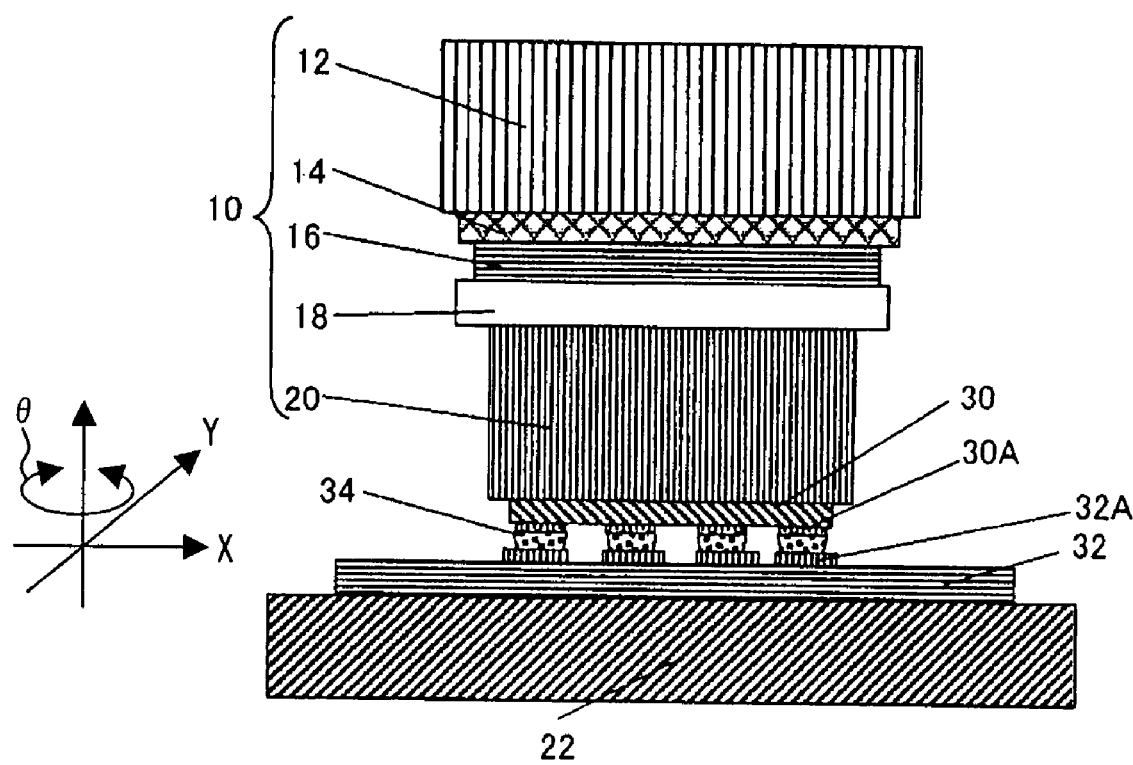
FIG. 3A is a sectional view of a third stage in the main process of the method of mounting the electronic component according to the first preferred embodiment.
FIG. 3B is a sectional view of a fourth stage in the main process of the method of mounting the electronic component according to the first preferred embodiment.
Figure 3:
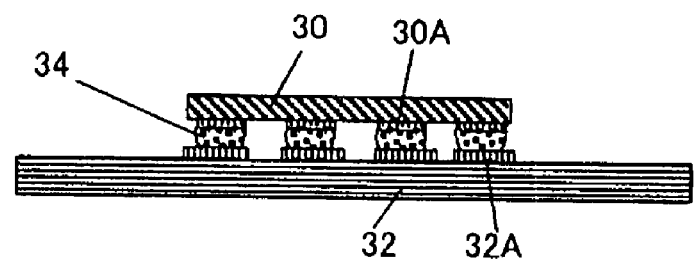

DESCRIPTION OF REFERENCE SYMBOLS 10, 40, 72 part loading tool
12, 42, 52 tool securing section
14, 48, 56 XYθ driving mechanism
16 heat blocking mechanism
18 securing mechanism
20, 44, 54, 74 retaining section
22, 46, 70 substrate securing table
24 pedestal
26 columnar support
28 horizontal moving section
30, 60 electronic component (semiconductor element)
30A, 60A electrode terminal
32, 62 wiring substrate
32A, 62A connecting terminal
34 solder bump
50 substrate loading tool
58 part securing table
64 resin composition
66 resin
68 solder powder
76 solder

PREFERRED EMBODIMENTS OF THE PRESENT INVENTION

Hereinafter, preferred embodiments of the present invention are described in detail referring to the drawings.

The like components are provided with the same reference symbols and may not be described again.

Preferred Embodiment 1

Figure 4:
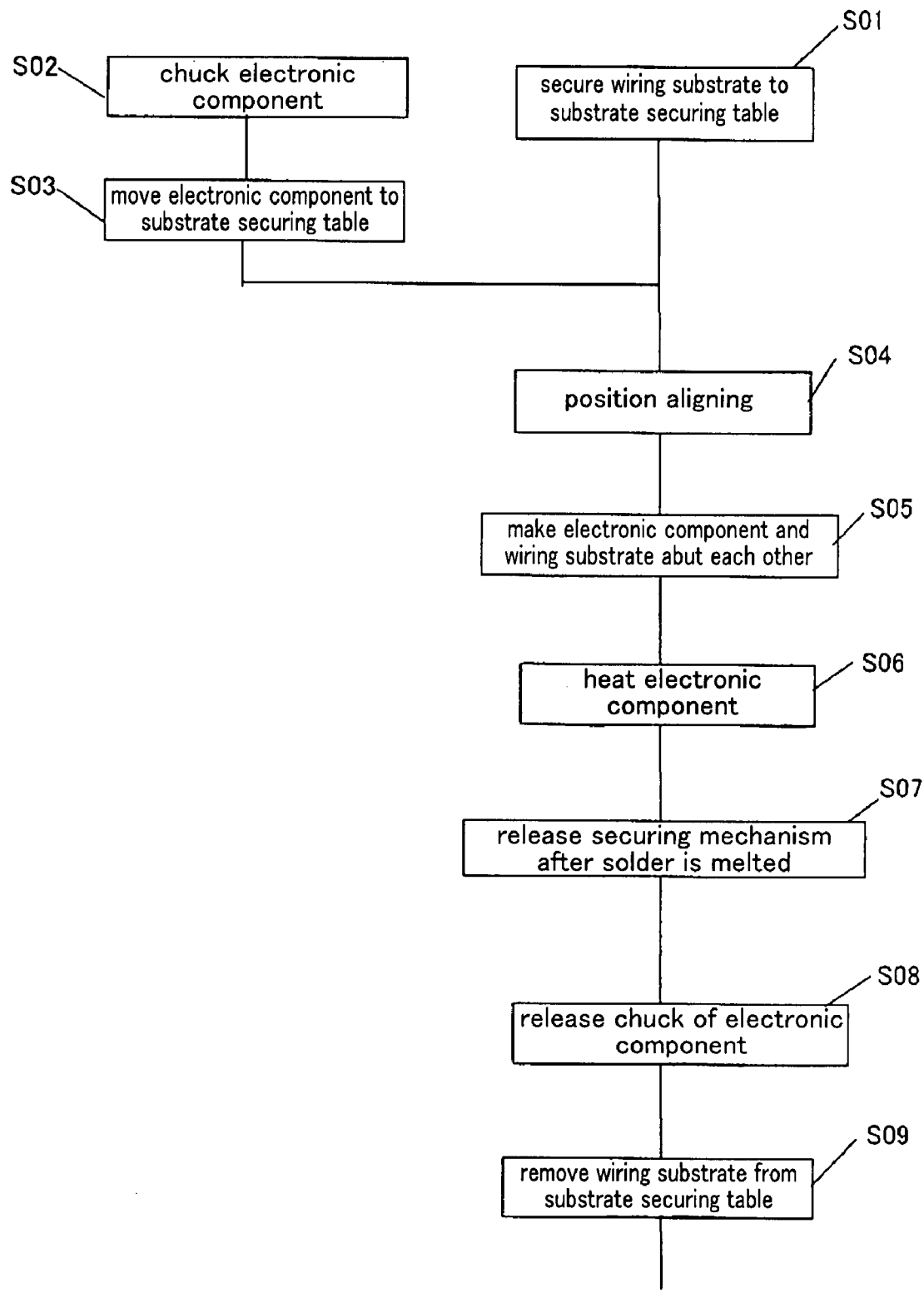
FIG. 4 is a flow chart of an electronic component mounting process according to the first preferred embodiment.
Figure 5:
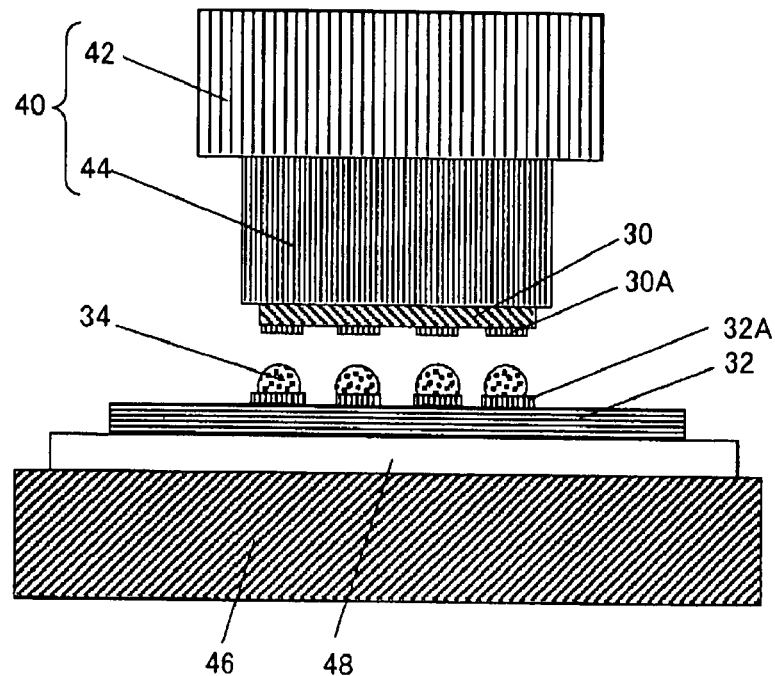
FIG. 5A is a sectional view of a first stage in a main process of a method of mounting an electronic component according to a second preferred embodiment of the present invention.
FIG. 5B is a sectional view of a second stage in the main process of the method of mounting the electronic component according to the second preferred embodiment.
Figure 5:
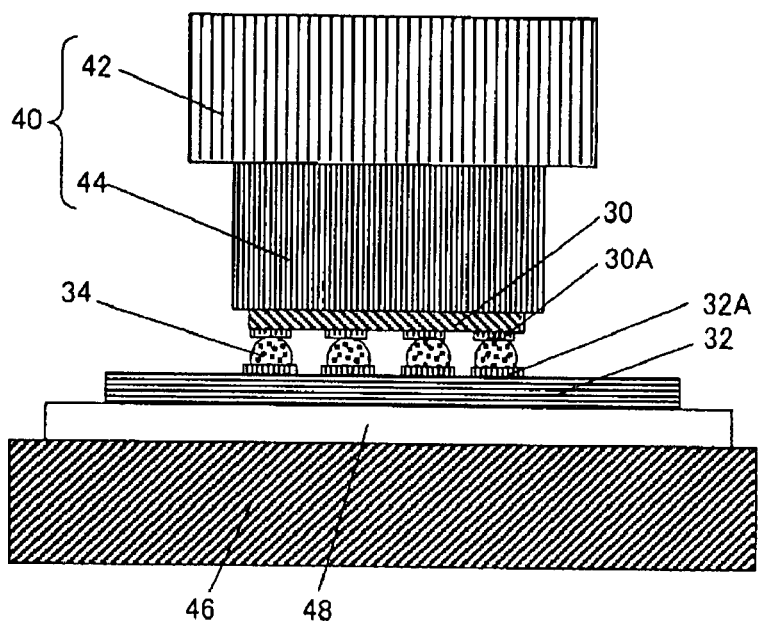
Figure 6:
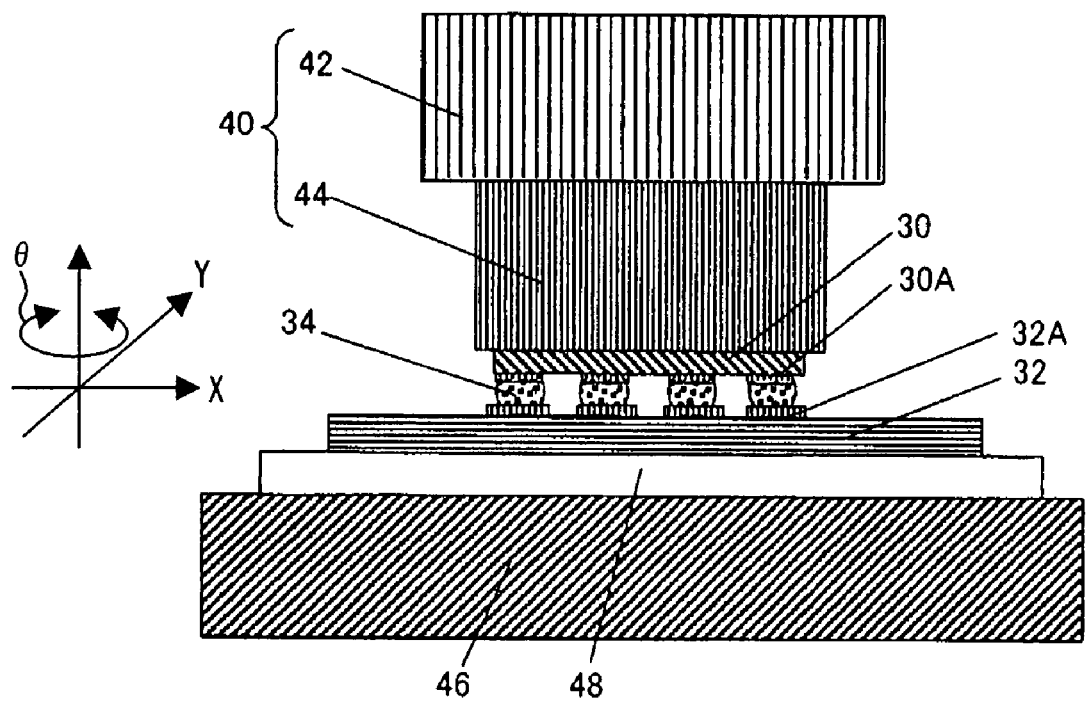
FIG. 6A is a sectional view of a third stage in the main process of the method of mounting the electronic component according to the second preferred embodiment.
FIG. 6B is a sectional view of a fourth stage in the main process of the method of mounting the electronic component according to the second preferred embodiment.
Figure 6:
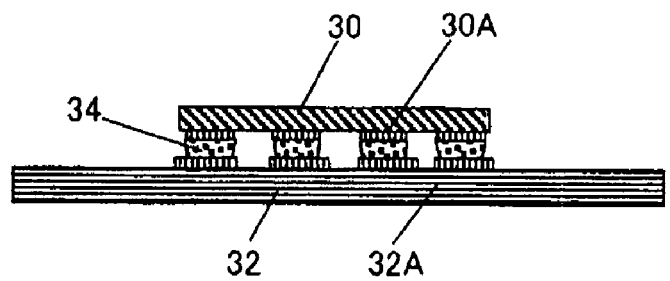
Figure 7:
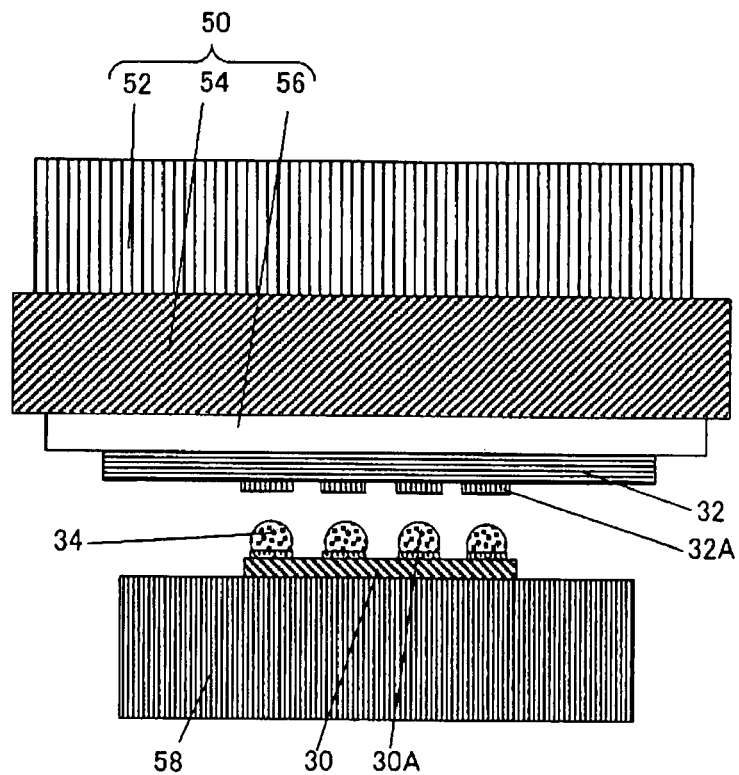
FIG. 7A is a sectional view of a first stage in a main process of a method of mounting an electronic component according to a third preferred embodiment of the present invention.
FIG. 7B is a sectional view of a second stage in the main process of the method of mounting the electronic component according to the third preferred embodiment.
Figure 7:
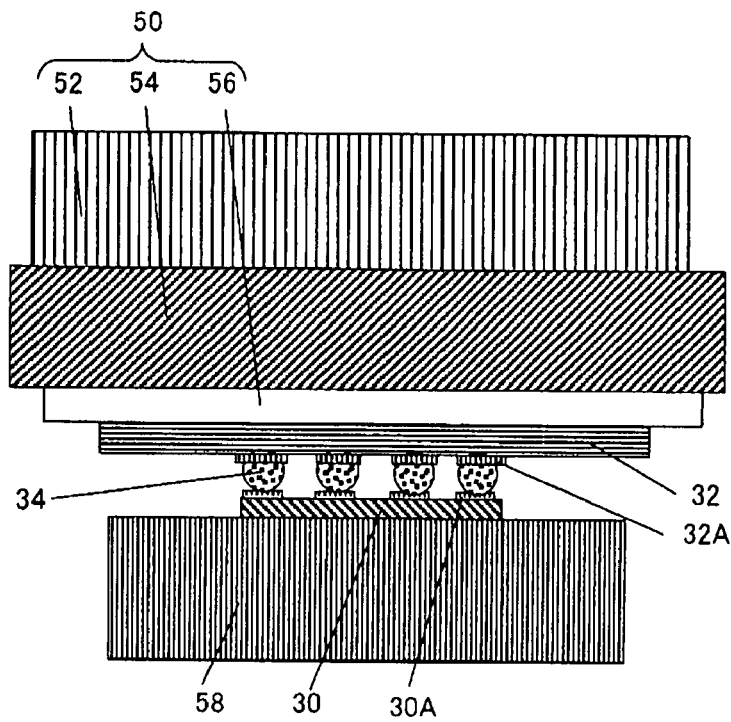
Figure 8:
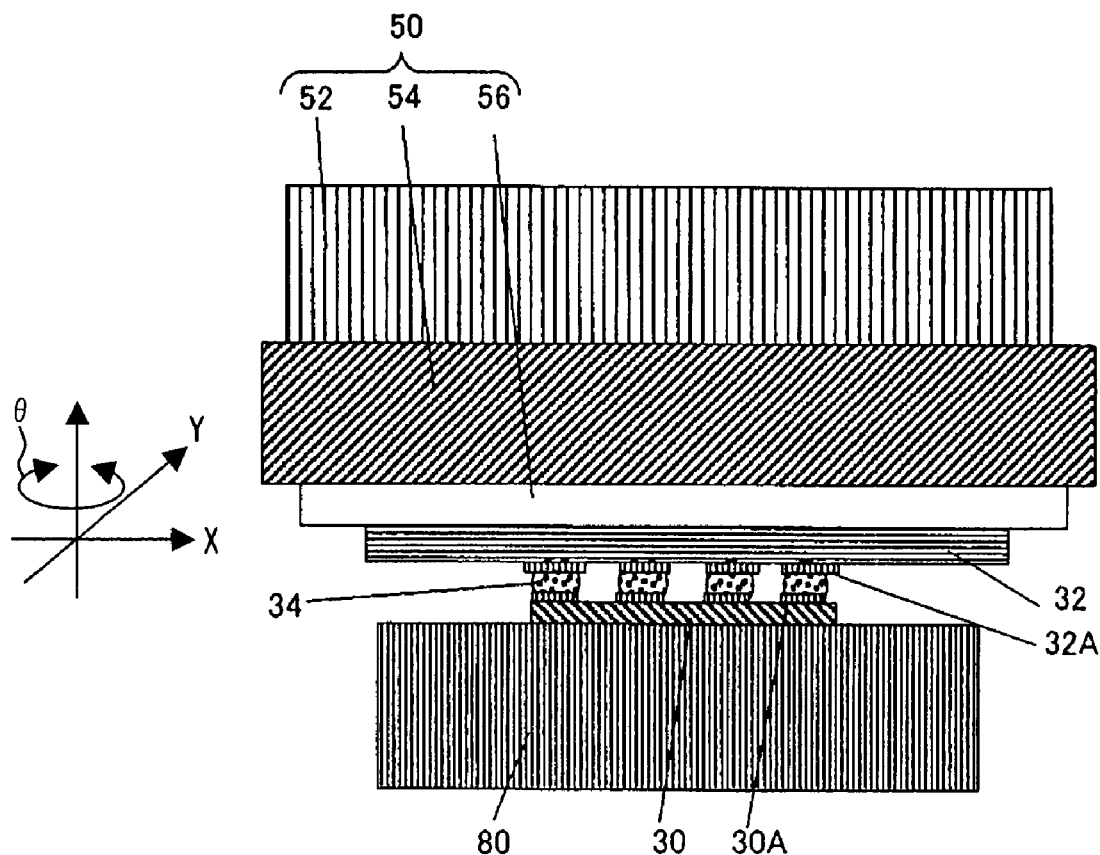
FIG. 8A is a sectional view of a third stage in the main process of the method of mounting the electronic component according to the third preferred embodiment.
FIG. 8B is a sectional view of a fourth stage in the main process of the method of mounting the electronic component according to the third preferred embodiment.
Figure 8:
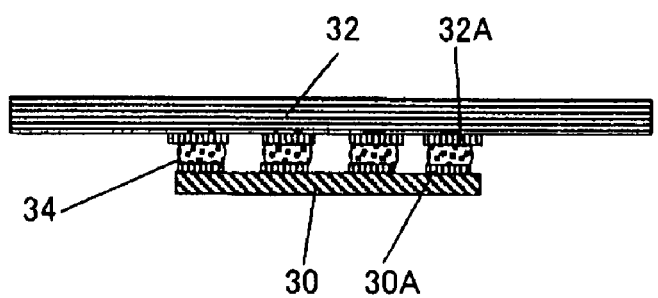

FIGS. 1-4 are the drawings for describing a method of and a device for mounting an electronic component according to a first preferred embodiment of the present invention. FIG. 1 is a sectional view illustrating a schematic constitution of the electronic component mounting device according to the present preferred embodiment. FIGS. 2A, 2B, 3A and 3B are sectional views of a main process of the method of mounting the electronic component according to the present preferred embodiment. FIG. 4 is a flow chart according to the present preferred embodiment.

As shown in FIG. 1, in the electronic component mounting device according to the present preferred embodiment, a part loading tool 10 and a substrate securing table 22 are provided on a pedestal 24. The part loading tool is retained by a columnar support 26 and a horizontal moving section 28 standingly provided on the pedestal 24. The columnar support 26 moves the part loading tool 10 upward and downward, and the horizontal moving section 28 horizontally moves the part loading tool 10 to thereby roughly determine a position.

The part lading tool 10 comprises a tool securing section 12, an XYθ driving mechanism 14, a heat blocking mechanism 16, a securing mechanism 18 and a retaining section 20. Further, a heating mechanism is provided inside the retaining section 20, and the electronic component can be heated to a predetermined temperature by the heating mechanism. The heat blocking mechanism 16 is provided to control heat transmission to the XYθ driving mechanism 14 when the electronic component is heated by the heating mechanism of the retaining section 20. A porous ceramic plate, for example, may be fixedly used as the heat blocking mechanism 16, or heat-resistant resin such as polyimide may be used.

Further, the part loading tool 10 comprises a mechanism for holding the electronic component previously placed at a position not shown by the retaining section 20 and moving it to the substrate securing table 22, and a mechanism for moving it in the direction of the substrate securing table 22. These operations are controlled by a controller not shown.

Below is described the present preferred embodiment wherein a semiconductor element is used as the electronic component 30, and the semiconductor element is mounted on a wiring substrate 32.

On an entire area of one of surfaces of the semiconductor element 30 are formed electrode terminals 30A at constant pitches, and the electrode terminals 30A are provided with solder bumps 34. The solder bumps 34 may be formed in such a manner that solder balls are fixedly bonded with paste or the like, or may be formed by means of plating. The wiring substrate 32 is provided with connecting terminals 32A at a position where the semiconductor element 30 is mounted. The wiring substrate 32 may be a double-sided wiring substrate or a multilayered wiring substrate. Further, the wiring substrate may be formed mainly from resin or ceramic, or may be a silicon substrate or a glass substrate on which wirings are formed.

Below is described the mounting method according to the present preferred embodiment referring to FIGS. 2A-4.

First, the wiring substrate 32 is secured by the substrate securing table 22 (S01). Next, the semiconductor element 30 is held by the part loading tool 10 at a position not shown (S02) and moved to the substrate securing table 22 (S03). After the semiconductor element 30 is moved to the substrate securing table 22, the electrode terminals 30A of the semiconductor element 30 and the connecting terminals 32A of the wiring substrate 32 are position-aligned (S-04). This state is shown in FIG. 2A.

As shown in FIG. 2B, the part loading tool 10 is moved to the wiring substrate 32 while the position-aligning state is maintained, so that the semiconductor element 30 is made to abut the wiring substrate 32 (S05).

Next, the heating mechanism provided in the retaining section 20 is operated so that the semiconductor element 30 is heated (S06), and the solders 34 formed on the electrode terminals 30A of the semiconductor element 30 are thereby melted.

As shown in FIG. 3A, the securement of the XYθ driving mechanism 14 by the securing mechanism 18 is released after the solders 34 are melted (S07). The XYθ driving mechanism 14 can be thereby driven, and the components from the XYθ driving mechanism 14 through the retaining section 20 including the semiconductor element 30 can be freely moved only in the XYθ direction with reference to the surface of the wiring substrate 32 while the abutting state (more specifically, an interval generated between the wiring substrate 32 and the electronic component 30) is maintained. Therefore, when the solders 34 are melted and the self-alignment effect is thereby produced, the semiconductor element 30 is subjected to the self-alignment effect and thereby easily moved.

Next, the heating process by the heating mechanism is halted so that the solders 34 are solidified. After the solders 34 are completely solidified, the holding operation by the part loading tool 10 is released (S08). Further, when the wiring substrate 32 is thereafter removed from the substrate securing table 22, the electronic component mounting structure shown in FIG. 3B is obtained.

According to the mounting method and the mounting device thus described, the mounting structure wherein any displacement is not caused and the interval between the semiconductor element 30 and the wiring substrate 32 is constantly retained can be obtained. Therefore, the electronic component can be mounted with fine pitches and prevented from being tilted. As a result, reliability can be further improved in comparison to the conventional mounting method and mounting device.

In the present preferred embodiment, the heating mechanism is provided in the retaining section 20 of the part loading tool 10; however, the heating mechanism may be provided in the substrate securing table 22 so that the heat can be applied from the substrate securing table 22. In such a manner, the heat blocking mechanism 16 can be simply configured, or may be omitted.

Second Preferred Embodiment

FIGS. 5A-6B are the drawings for describing a device for mounting an electronic component according to a second preferred embodiment of the present invention and a method of mounting an electronic component in which the device is used. A general shape of the electronic component mounting device according to the present preferred embodiment is the same as that of the electronic component mounting device shown in FIG. 1. In the description of the present preferred embodiment, the semiconductor element is used as the electronic component.

The electronic component mounting device according to the present preferred embodiment is described referring to the sectional view of the process shown in FIG. 5A based on differences in comparison to FIG. 1. A part loading tool 40 comprises a tool securing section 42 and a retaining section 44. Inside the retaining section 44 is provided a heating mechanism for heating the semiconductor element 30, which is not shown. Further, a mechanism for making the semiconductor element 30 and the wiring substrate 32 abut each other in parallel is provided, which is not shown either.

An XYθ driving mechanism 48 is provided between a substrate securing table 46 and the wiring substrate 32. Inside the substrate securing table 46 is provided a securing mechanism for securing the XYθ driving mechanism 48 (not shown).

In the case of the electronic component mounting device according to the present preferred embodiment, the XYθ driving mechanism 48 may be constituted in such a manner that a flexible bag-shape sheet is filled with liquid resistant to a melting temperature of the solders 34 such as oil, and the wiring substrate 32 is placed on a surface of the sheet. The securing mechanism in this case may be constituted in such a manner that an upward/downward mechanism of a pin higher than the sheet is provided and the pin directly contacts the wiring substrate 32 to be secured thereto.

Alternatively, the xyθ driving mechanism 48 may be constituted in such a manner that a flat plate is provided on an upper section of the substrate securing table 46, and gas such as nitrogen gas is sprayed onto an entire surface of the flat plate so that the flat plate is floated. In this case, the wiring substrate 32 is fixedly provided on the flat plate, and a gas source for spraying gas and a valve for transmitting gas correspond to the securing mechanism.

Below is described the mounting method in which the electronic component mounting device according to the present preferred embodiment is used referring to FIGS. 5A-6B. The mounting method according to the present preferred embodiment, which can be performed according to the same flow as shown in FIG. 4, is described referring to FIG. 4.

First, the wiring substrate 32 is secured by the substrate securing table 46 (S01). At the time, the wiring substrate 32 is movable only as a single piece which is integral with the substrate securing table 46 because the XYθ driving mechanism 48 is secured by the securing mechanism not shown.

The present preferred embodiment is described referring to an example where the solders 34 are formed on the surfaces of the connecting terminals 32A of the wiring substrate 32.

Next, the semiconductor element 30 is held by the part loading tool 40 at the position not shown (S02), and moved to the substrate securing table 46 (S03). After the semiconductor element 30 is moved to the substrate securing table 46, the electrode terminals 30A of the semiconductor element 30 and the connecting terminals 32A of the wiring substrate 32 are position-aligned (S04). This state is shown in FIG. 5A.

Next, as shown in FIG. 5B, the part loading tool 40 is moved in the direction of the wiring substrate 32 while the position-aligning state is maintained so that the semiconductor element 30 is made to abut the wiring substrate 32 (S05).

Next, the heating mechanism provided in the retaining section 44 is operated so that the semiconductor element 30 is heated (S06). The applied heat then melts the solders 34 formed on the connecting terminals 32A of the wiring substrate 32.

Next, as shown in FIG. 6A, after the solders 34 are melted, the securement of the XYθ driving mechanism by the securing mechanism is released (S07), and the XYθ driving mechanism 48 can be thereby driven. As a result, the wiring substrate 32 provided on the XYθ driving mechanism can be freely moved only in the XYθ direction with reference to the surface of the wiring substrate 32 while the abutting state with respect to the semiconductor element 30 (more specifically, interval generated between the wiring substrate 32 and the electronic component 30) is maintained. Therefore, when the solders 34 are melted and the self-alignment effect is thereby produced, the wiring substrate 32 is subjected to the self-alignment effect and thereby easily moved.

Next, the heating process by the heating mechanism is halted so that the solders 34 are solidified. When the solders 34 are completely solidified, the holding operation by the part loading tool 10 is released (S08). After that, the wiring substrate 32 is removed from the substrate securing table 46 (S09).

As a result, the electronic component mounting structure shown in FIG. 6B is obtained. The electronic component mounting structure thus obtained has the same structure as that of the electronic component mounting structure according to the first preferred embodiment.

According to the mounting method and the mounting device thus described, the mounting structure wherein any displacement is not caused and the interval between the semiconductor element 30 and the wiring substrate 32 is constantly retained can be obtained. Therefore, the electronic component can be mounted with fine pitches and prevented from being tilted. As a result, the reliability can be further improved in comparison to the conventional mounting method and mounting device.

Third Preferred Embodiment

FIGS. 7A-8B are the drawings for describing a device for mounting an electronic component according to a third preferred embodiment of the present invention and a method of mounting an electronic component in which the device is used. The electronic component mounting device according to the present preferred embodiment is different to the electronic component mounting device shown in FIG. 1 regarding the following points.

Firstly, in the electronic component mounting device according to the present preferred embodiment, the electronic component is secured by the part securing table, and then, the wiring substrate is held by the substrate loading tool and moved to the position where the electronic component is placed on the part securing table so as to abut the electronic component.

Secondly, the heating mechanism is placed on the part-securing-table side, and the XYθ driving mechanism is placed on the substrate-loading-tool side. The rest of the constitution, which is the same as that of the electronic component mounting device according to the first preferred embodiment, is not described again.

Below are described the electronic component mounting method, and also the constitution of the electronic component mounting device according to the present preferred embodiment. In the present preferred embodiment, the semiconductor element is used as the electronic component. The present preferred embodiment is described referring to the example where the solders 34 are formed on the surfaces of the connecting terminals 32A of the wiring substrate 32.

The electronic component mounting device according to the present preferred embodiment is described based on the differences in comparison to FIG. 1 referring to the sectional view of the process shown in FIG. 7A. A substrate loading tool 50 mainly comprises a tool securing table 52, a retaining section 54 and an XYθ driving mechanism 56. The substrate loading tool 50 further comprises a mechanism for making the semiconductor element 30 and the wiring substrate 32 abut each other in parallel with each other, which is not shown.

The XYθ driving mechanism 56 is provided between the retaining section 54 of the substrate loading tool 50 and the wiring substrate 32. Further, inside the retaining section 54 is provided a securing mechanism (not shown) for securing the XYθ driving mechanism 56. The description of the XYθ driving mechanism and the securing mechanism, which can be constituted as described in the second preferred embodiment, is omitted.

Figure 9:
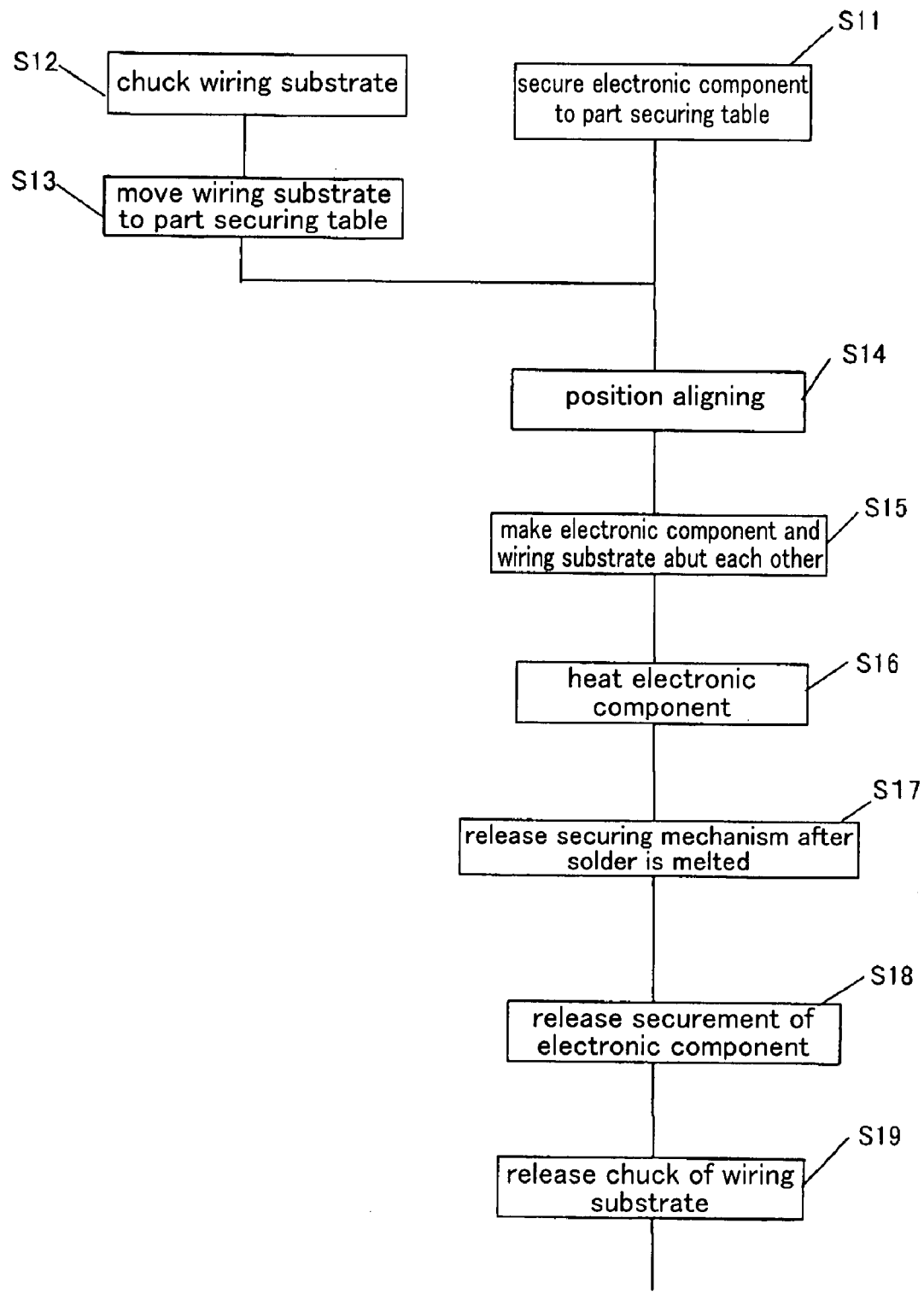
FIG. 9 is a flow chart of an electronic component mounting process according to the third preferred embodiment.

Below is described the mounting method wherein the electronic component mounting device according to the present preferred embodiment is used referring to the sectional views of the main process shown in FIGS. 7A-8B and the flow chart shown in FIG. 9.

First, the semiconductor element 32 is secured by the part securing table 58 (S11).

Next, at a position not shown, the semiconductor element 30 is held by the substrate loading tool 50 (S12) and moved to the part securing table 58 (S13). After the semiconductor element 30 is moved to the part securing table 58, the connecting terminals 32A of the wiring substrate 32 and the electrode terminals 30A of the semiconductor element 30 are position-aligned (S14). This state is shown in FIG. 7A.

Next, as shown in FIG. 7B, the substrate loading tool 50 is moved in the direction of the semiconductor element 30 while the position-aligning state is maintained, and the semiconductor element 30 is thereby made to abut the wiring substrate 32 (S15). At the time, the wiring substrate 32 is movable only as a single piece which is integral with the substrate loading tool 50 because the XYθ driving mechanism 56 is secured by the securing mechanism not shown.

Next, the heating mechanism provided in the part securing table 58 is operated so that the semiconductor element 30 is heated (S16). The applied heat then melts the solders 34 formed on the connecting terminals 32A of the wiring substrate 32.

As shown in FIG. 8A, the securement of the XYθ driving mechanism 56 by the securing mechanism is released after the solders 34 are melted (S17). The XYθ driving mechanism 56 can be thereby driven, and the wiring substrate 32 provided on the XYθ driving mechanism 56 can be freely moved only in the XY θ direction with reference to the surface of the wiring substrate 32 while the abutting state with respect to the semiconductor element 30 (more specifically, an interval generated between the wiring substrate 32 and the electronic component 30) is maintained. Therefore, when the solders 34 are melted and the self-alignment effect is thereby produced, the wiring substrate 32 is subjected to the self-alignment effect and thereby easily moved.

Next, the heating process by the heating mechanism is halted so that the solders 34 are solidified. When the solders 34 are completely solidified, the securement of the semiconductor element 30 with respect to the part securing table 58 is released (S18). After that, the wiring substrate 32 is moved together with the substrate loading tool 50, and then, the hold of the wiring substrate 32 is released (S19).

As a result, the electronic component mounting structure shown in FIG. 8B is obtained. The electronic component mounting structure thus obtained has the same structure as those of the electronic component mounting structures according to the first and second preferred embodiments.

According to the mounting method and the mounting device thus described, the mounting structure wherein any displacement is not caused and the gap between the semiconductor element 30 and the wiring substrate 32 is constantly retained can be obtained. Therefore, the electronic component can be mounted with fine pitches and prevented from being tilted. As a result, the reliability can be further improved in comparison to the conventional mounting method and mounting device.

Fourth Preferred Embodiment

FIGS. 10A-11B are sectional views for describing a method of and a device for mounting an electronic component according to a fourth preferred embodiment of the present invention. The electronic component mounting device according to the present preferred embodiment is different to the electronic component mounting device described in the first preferred embodiment regarding the following points.

Firstly, the heating mechanism is provided, not in the retaining section 74 of the part loading tool 72, but inside a substrate securing table 70.

Secondly, an application mechanism (not shown) for applying a resin composition 64 to a surface of a wiring substrate 62.

The rest of the constitution, which is the same as that of the electronic component mounting device according to the first preferred embodiment, is not described again.

In the present preferred embodiment, the electronic component mounting device thus constituted is used so that a semiconductor element 60, which is an electronic component, and the wiring substrate 62 are mounted by means of the resin composition including the solder powder, convective additive and resin having fluidity at a melting temperature of the solder powder.

Figure 10A:
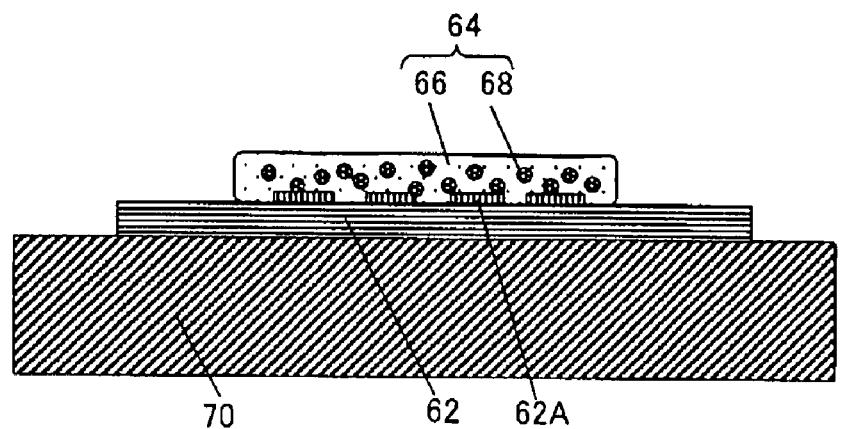
FIG. 10A is a sectional view of a first stage in a main process of a method of mounting an electronic component according to a fourth preferred embodiment of the present invention.

Below are described the electronic component mounting method, and also the constitution of the electronic component mounting device according to the present preferred embodiment. As shown in FIG. 10A, surfaces of electrode terminals 60A of the semiconductor element 60 before it is mounted and connecting terminals 62A of the wiring substrate 62 are not provided with any solder. Further, the electrode terminals 60A and the connecting terminals 62A are formed in substantially the same shape, and a region where the solders are self-assembled and grown is formed in, for example, a circular shape. When the solders are selectively self-assembled and grown in the circular section, the solders grown on the connecting terminals 62A of the wiring substrate 62 and the solders grown on the electrode terminals 62A of the semiconductor element 60 are consequently integrally combined with each other, which realizes the connection. As a material for at least the surfaces of the electrode terminals 60A and the connecting terminals 62A is desirably used such a metallic material that is superior in wettability with respect to the solder.

Examples of the metallic material having such a good wettability with respect to the solders include gold (Au), silver (Ag), copper (Cu), nickel (Ni), palladium (Pd), rhodium (Rh), platinum (Pt) and iridium (Ir), and also, tin (Sn), indium (In) and the like which constitute the solder.

In order to prevent the self assembly of the solders in a region other than the connecting region, any part other than the surfaces of the electrode terminals 60A and the connecting terminals 62A is desirably provided with a surface protection film formed from an inorganic material such as an oxide film, an nitrided film or an oxide nitrided film or a surface protection film formed from resin such as polyimide.

Below is described in detail the electronic component mounting method according to the present preferred embodiment referring to FIGS. 10A-11B.

First, as shown in FIG. 10A, the wiring substrate 62 is secured by the substrate securing table 70, and then, a predetermined amount of the resin composition 64 is applied to the mounting position on the wiring substrate 62 by means of the application mechanism not shown. More specifically, the predetermined amount is at least such an amount that surely fills a gap between the semiconductor element 60 and the wiring substrate 62 made when the semiconductor element 60 abuts the wiring substrate 62. The resin composition 64 used then preferably has a paste form and a relatively large viscosity. The resin composition 64 includes solder powder 68, convective additive (not shown) and resin 66 having fluidity at a melting temperature of the solder powder 68 as its main constituents. As the convective additive is used a material which is boiled or dissolved at least at the melting temperature of the solder powder 68 so as to generate gas. The material can be obtained when liquid such as isopropyl alcohol, butylacetate, ethyleneglycol or butylcarbitol is mixed with the resin 66. Any material which is generally used for soldering such as tin (Sn)-silver (Ag)-copper (Cu) can be used as the solder powder 68.

The semiconductor element 60 is held by the part loading tool 72 at a position not shown and moved to the substrate securing table 70. After the semiconductor element 60 is moved to the substrate securing table 70, the electrode terminals 60A of the semiconductor element 60 and the connecting terminals 62A of the wiring substrate 62 are position-aligned.

Figure 10B:
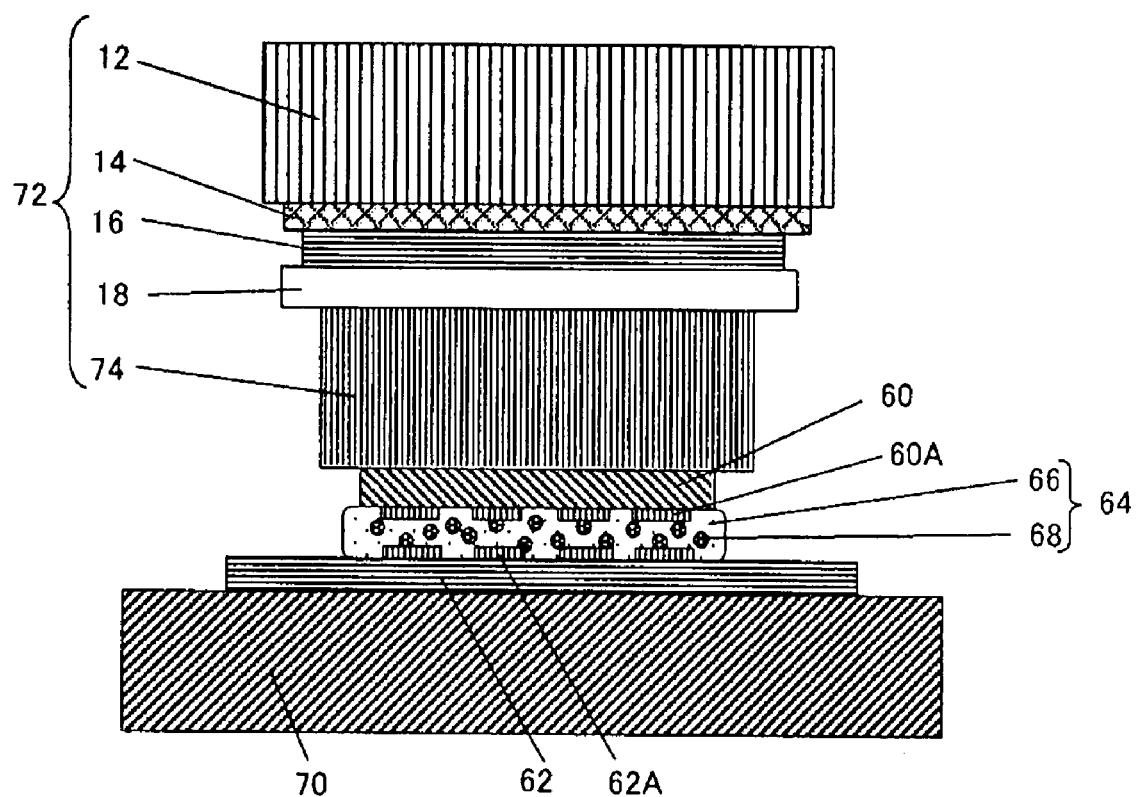
FIG. 10B is a sectional view of a second stage in the main process of the method of mounting the electronic component according to the fourth preferred embodiment.

Next, as shown in FIG. 10B, the part loading tool 72 is moved in the direction of the wiring substrate 62 while the position-aligning state is maintained, so that the semiconductor element 60 abuts the resin composition 64 on the wiring substrate 62. When the semiconductor element 60 abuts the resin composition 64, the resin composition 64 evenly spreads between the semiconductor element 60 and the wiring substrate 62 and retains a predetermined thickness. After that, the part loading tool 74 retains a certain interval and a degree of parallelization between the semiconductor element 60 and the wiring substrate 62.

Next, the heating mechanism (not shown) provided inside the substrate securing table 70 is operated so that the wiring substrate 62 is heated. The heat applied then melts the solders 68 in the resin composition 64, and reduces the viscosity of the resin 66 and increases the fluidity. At the same time, the convective additive (not shown) is boiled or dissolved, and gas is thereby discharged. The resin composition 64 including the discharged gas then fills the space confined by the semiconductor element 60 and the wiring substrate 62. Therefore, the gas is released into an external space from the interval in the outer peripheral region of the semiconductor element 60 and the wiring substrate 62.

Therefore, the generated gas is convected in the resin composition 64, reaches the outer peripheral part and is discharged into the external space. The solder powder 68 is subjected to an energy generated by the convected gas and wildly moves around in the resin composition 64. When the solder powder 68, in up-and-down movements, contacts the electrode terminals 60A and the connecting terminals 62A, whose surfaces are favorably wettable with respect to the solder, the solder powder 68 is captured on the surfaces of these terminals and melted, and then, grown.

At the time when the solder is thus grown and no more gas is discharged from the convective additive, the electrode terminals 60A and the connecting terminals 62A are connected by the solders 76. This state is shown in FIG. 11A.

Figure 11A:
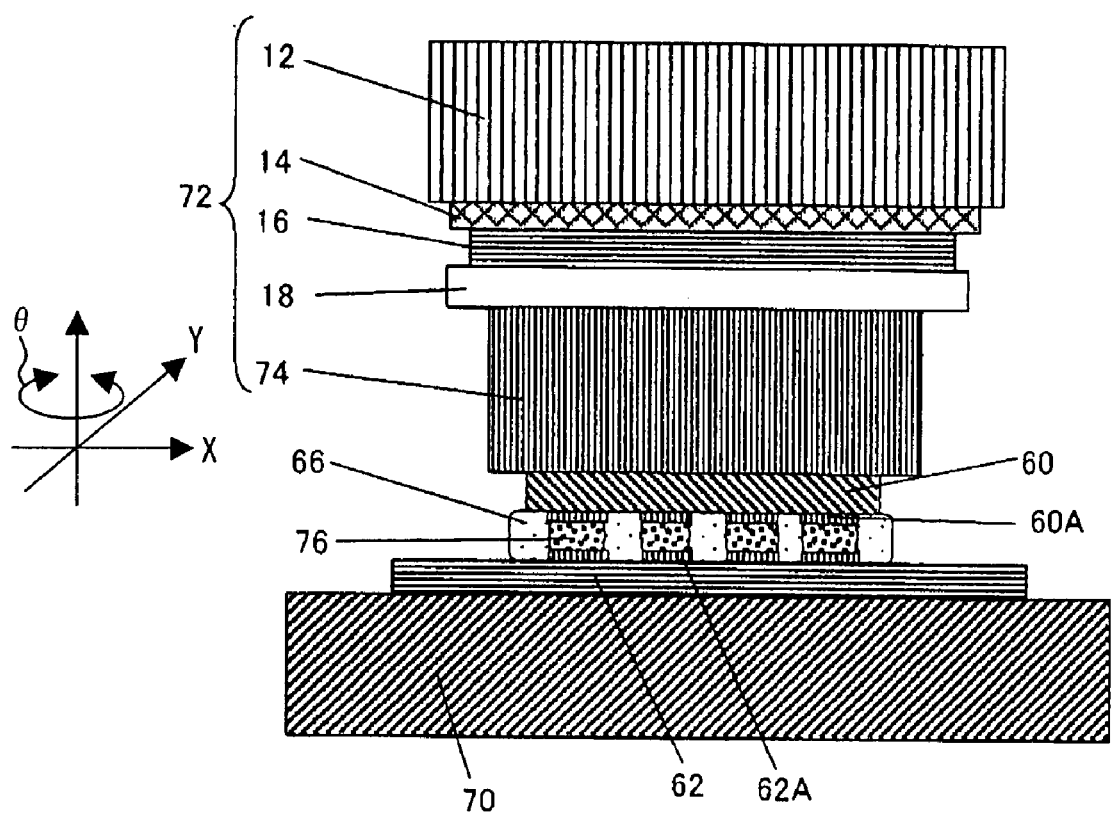
FIG. 11A is a sectional view of a third stage in the main process of the method of mounting the electronic component according to the fourth preferred embodiment.

As shown in FIG. 11A, after the electrode terminals 60A and the connecting terminals 62A are connected by the solders 76, the securing mechanism 18 is released so that the XYθ driving mechanism 14 is operated. When the XYθ driving mechanism 14 is driven, the self-alignment effect is produced since the solders 76 are still in the melted state. The semiconductor element 60 finely moves under the influence of the self-alignment force. As a result, the displacement can be resolved.

Next, when the heating temperature is increased by the heating mechanism, the resin 66 constituting the resin composition 64 is hardened. After the hardening is completed, the heating process is halted so that the solders 76 are solidified. After the solders 76 are completely solidified, the hold by the part loading tool 72 is released.

Figure 11B:
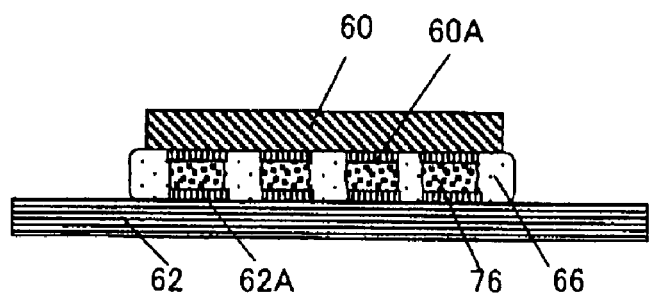
FIG. 11B is a sectional view of a fourth stage in the main process of the method of mounting the electronic component according to the fourth preferred embodiment.

When the wiring substrate 62 is thereafter removed from the substrate securing table 70, the electronic component mounting structure shown in FIG. 11B is obtained.

According to the mounting method and the mounting device thus constituted, the soldering process in which the resin composition 64 is used can be performed in a stable manner and with a good reproducibility. The soldering method, which does not require the formation of any solder bump or the like, is characterized in that the process thereof can be simplified, and the mounting process with fine pitches can be realized.

The electronic component mounting device according to the present invention may comprise a part securing table for securing the electronic component so that the surface on which the electrode terminals of the electronic component are formed and a surface opposite thereto are in contact with each other, a substrate loading tool for holding the wiring substrate and moving it on the surface on which the electrode terminals of the electronic component are formed so that the wiring substrate abuts the electronic component, a heating mechanism for heating the electronic component provided on the part securing table, an XYθ driving mechanism capable of finely moving the wiring substrate on the surface where the electrode terminals of the electronic component are formed in the XY θ direction in the state where the wiring substrate is secured, and a securing mechanism for securing the drive of the XYθ driving mechanism.

When the electronic component mounting device thus constituted is used to perform the electronic component mounting method, an effect similar to those of the preferred embodiment described so far can be obtained.

The electronic component mounting device according to the present invention may comprise a part securing table for securing the electronic component so that the surface on which the electrode terminals of the electronic component are formed and a surface opposite thereto are in contact with each other, an application mechanism for applying the resin composition including the solder powder, convective additive and the resin having the fluidity at the melting temperature of the solder powder to the surface on which the electrode terminals of the electronic component are formed, a substrate loading tool for holding the wiring substrate and moving it, and making the surface of the resin composition and the surface on which the connecting terminals of the wiring substrate are formed abut each other after causing the electrode terminals and the connecting terminals to face each other, and a heating mechanism for heating at least one of the wiring substrate and the electronic component.

In the foregoing constitution, the substrate loading tool may further comprise an XYθ driving mechanism capable of holding the wiring substrate and finely moving it with reference to the surface on which the electrode terminals of the electronic component are formed in the XYθ direction. The XYθ driving mechanism may be set to be operated in the state where the solders are melted after the electrode terminals and the connecting terminals are connected by means of the solders. Further, a function for further heating the heated solder connection to a temperature higher than the previous heating temperature may be further provided in the heating mechanism.

When the electronic component mounting device thus constituted is used to perform the electronic component mounting method, an effect similar to those of the preferred embodiment described so far can be obtained.

INDUSTRIAL APPLICABILITY

The electronic component mounting method and the electronic component mounting device according to the present invention can effectively exert the self-alignment effect which is produced when the solders are melted, and can perform the soldering process of the various electronic components with a higher accuracy.

Further, the method and the device, wherein a good yielding percentage and a stable soldering process can be realized when the resin composition is used, is useful to the manufacturing of an electronic circuit substrate.

What is claimed is:

1. A method of mounting an electronic component comprising an electrode terminal on a wiring substrate comprising a connecting terminal via solder, comprising:
   a first step for securing one of the wiring substrate and the electronic component;
   a second step for applying a resin composition including solder powder, convective additive and resin having fluidity at a melting temperature of the solder powder to a region where the connecting terminal is formed or a surface on which the electrode terminal is formed in one of the wiring substrate and the electronic component which is secured;
   a third step for making the electrode terminal of the electronic component and the connecting terminal of the wiring substrate abut each other with the resin composition interposed therebetween in a state where one of the wiring substrate and the electronic component, whichever is not secured, is held; and
   a fourth step for adhering the electrode terminal and the connecting terminal with each other using the solder powder by heating at least one of the wiring substrate and the electronic component while the state where the electrode terminal and the connecting terminal abut each other is retained, wherein:

the solder powder is melted, and the melted solder powder is grown in such a manner that the solder powder is self-assembled between the electrode terminal and the connecting terminal by the convective additive, so that the electrode terminal and the connecting terminal are solder-connected to each other in the fourth step, and the convective additive comprises a material which generates a gas by boiling or dissolving at the melting temperature of the solder powder.

2. The method of mounting an electronic component as claimed in claim 1, wherein the wiring substrate is secured by a substrate securing table in the first step, the resin composition is applied to the region where connecting terminal of the wiring substrate is formed in the second step, and the electronic component is held by a part loading tool, and the connecting terminal and the electrode terminal face each other in the state where the electronic component is held, so that the surface on which the electrode terminal of the electronic component is formed and the resin composition abut each other in the third step.

3. The method of mounting an electronic component as claimed in claim 2, wherein the loading tool is finely movable in the XYθ direction with reference to a surface of the wiring substrate in a state where the electronic component is held by the loading tool after the electrode terminal and the connecting terminal are connected by means of the melted solder powder in the fourth step.

4. The method of mounting an electronic component as claimed in claim 1, wherein the electronic component is secured by a part securing table in such a manner that a surface of the electronic component opposite to the surface thereof on which the electrode terminal is formed is made to contact the part securing table in the first step, the resin composition is applied to the surface on which the electrode terminal of the electronic component is formed in the second step, and the wiring substrate is held by a substrate loading tool, and the connecting terminal and the electrode terminal face each other in the state where the wiring substrate is held, so that the region where the connecting terminal of the wiring substrate is formed and the resin composition abut each other in the third step.

5. The method of mounting an electronic component as claimed in claim 2, wherein after the electrode terminal and the connecting terminal are bonded to each other by means of the melted solder powder, the substrate securing table is finely movable in the XYθ direction with reference to a surface of the wiring substrate in the state where the wiring substrate is secured by the substrate securing table in the fourth step.

6. The method of mounting an electronic component as claimed in claim 4, wherein after the electrode terminal and the connecting terminal are bonded to each other by means of the melted solder powder, the substrate loading tool is finely movable in the XYθ direction with reference to a surface of the wiring substrate in the state where the wiring substrate is held by the substrate loading tool in the fourth step.

7. The method of mounting an electronic component as claimed in claim 4, wherein after the electrode terminal and the connecting terminal are bonded to each other by means of the melted solder powder, the part loading tool is finely movable in the XYθ direction with reference to a surface of the wiring substrate in the state where the electronic component is held by the part securing table in the fourth step.

8. The method of mounting an electronic component as claimed in claim 3, wherein the part loading tool is finely movable by a driving force generated from self alignment of the melted solder in the fourth step.

9. The method of mounting an electronic component as claimed in claim 5, wherein the substrate securing table is finely movable by a driving force generated from self alignment of the melted solder in the fourth step.

10. The method of mounting an electronic component as claimed in claim 6, wherein the substrate loading tool is finely movable by a driving force generated from self alignment of the melted solder in the fourth step.

11. The method of mounting an electronic component as claimed in claim 7, wherein the part securing table is finely movable by a driving force generated from self alignment of the melted solder in the fourth step.

12. The method of mounting an electronic component as claimed in claim claim 2, further comprising, after the fourth step:

a fifth step for hardening the resin in the resin composition by further applying heat; and a sixth step for releasing the hold of the electronic component by the part loading tool after the resin is hardened.

13. The method of mounting an electronic component as claimed in claim 4, further comprising, after the fourth step:

a fifth step for hardening the resin in the resin composition by further applying heat; and a sixth step for releasing the hold of the wiring substrate by the substrate loading tool after the resin is hardened.

14. The method of mounting an electronic component as claimed in claim 1, wherein the electronic component is a semiconductor element, and a metallic material having wettability with respect to the solder powder is previously formed on surfaces of the electrode terminal of the semiconductor element and the connecting terminal of the wiring substrate.

15. An electronic component mounting device for mounting an electronic component comprising an electrode terminal on a wiring substrate comprising a connecting terminal via solder, comprising:

a securing table for securing one of the electronic component and the wiring substrate;

a application mechanism for applying a resin composition including solder powder, convective additive and resin having fluidity at a melting temperature of the solder powder to a region where the connecting terminal is formed or a surface on which the electrode terminal is formed in one of the wiring substrate and the electronic component which is secured by the securing table;

a loading tool for making the electrode terminal of the electronic component and the connecting terminal of the wiring substrate abut each other with the resin composition interposed therebetween in a state where one of the wiring substrate and the electronic component, whichever is not secured, is held; and a heating mechanism for heating at least one of the wiring substrate and the electronic component in the state where the electrode terminal and the connecting terminal abut each other, wherein the convective additive comprises a material which generates a gas by boiling or dissolving at the melting temperature of the solder powder.

16. The electronic component mounting device as claimed in claim 15, wherein
the securing table secures the wiring substrate,
the application mechanism applies the resin composition to the region where the connecting terminal of the wiring substrate is formed, and
the loading tool holds the electronic component and moves the held electronic component to the connecting terminal of the wiring substrate and makes the electrode terminal of the electronic component and the connecting terminal of the wiring substrate abut each other.

17. The electronic component mounting device as claimed in claim 15, wherein
the loading tool holds the electronic component and further comprises an XYθ driving mechanism for holding the electronic component and finely moving the held electronic component with reference to a surface of the wiring substrate in the XYθ direction.

18. The electronic component mounting device as claimed in claim 17, wherein
the XYθ driving mechanism is operated in the state where the solder is melted after the electrode terminal and the connecting terminal are connected to each other by means of the solder.

19. The electronic component mounting device as claimed in claim 15, wherein
the securing table secures the wiring substrate and further comprises an XYθ driving mechanism for finely moving the secured wiring substrate with reference to the surface on which the electrode terminal of the electronic component is formed in the XYθ direction.

20. The electronic component mounting device as claimed in claim 19, wherein
the XYθ driving mechanism is operated in the state where the solder is melted after the electrode terminal and the connecting terminal are connected to each other by means of the solder.

21. The electronic component mounting device as claimed in claim 15, wherein
the securing table secures the electronic component in such a manner that a surface of the electronic component opposite to the surface thereof on which the electrode terminal is formed contacts the part securing table,
the application mechanism applies the resin composition to a surface of the electronic component on which the electrode terminal is formed, and
the loading tool holds the wiring substrate and moves the held wiring substrate to the electrode terminal of the electronic component and makes the electrode terminal of the electronic component and the connecting terminal of the wiring substrate abut each other.

22. The electronic component mounting device as claimed in claim 15, wherein
the loading tool holds the wiring substrate and further comprises an XYθ driving mechanism for finely moving the held wiring substrate with reference to the surface on which the electrode terminal of the electronic component is formed in the XYθ direction.

23. The electronic component mounting device as claimed in claim 22, wherein
the XYθ driving mechanism is operated in the state where the solder is melted after the electrode terminal and the connecting terminal are connected to each other by means of the solder.

24. The electronic component mounting device as claimed in claim 15, wherein
the heating mechanism further comprises a function for further heating the heated solder to a temperature higher than the previous heating temperature.

25. The electronic component mounting device as claimed in claim 15, wherein
the XYθ driving mechanism further comprises a heat blocking mechanism for controlling heat transmitted from the heating mechanism to the electronic component or the wiring substrate.

* * * * *